(12) United States Patent
Maula et al.

(10) Patent No.: US 7,294,360 B2
(45) Date of Patent: Nov. 13, 2007

(54) CONFORMAL COATINGS FOR MICRO-OPTICAL ELEMENTS, AND METHOD FOR MAKING THE SAME

(75) Inventors: Jarmo Ilmari Maula, Espoo (FI); Runar Olof Ivar Törnqvist, Kauniainen (FI)

(73) Assignee: Planar Systems, Inc., Beaverton, OR (US)

( * ) Notice: Subject to any disclaimer, the term of this patent is extended or adjusted under 35 U.S.C. 154(b) by 0 days.

(21) Appl. No.: 10/404,928

(22) Filed: Mar. 31, 2003

(65) Prior Publication Data

US 2004/0197527 A1  Oct. 7, 2004

(51) Int. Cl.
*B05D 5/06* (2006.01)

(52) U.S. Cl. ............... 427/162; 427/163.1; 427/163.2; 427/164; 427/166; 427/167; 427/248.1; 427/255.15; 427/255.19; 427/255.23; 427/255.26; 427/255.7; 427/402; 427/419.2; 427/419.3; 117/84; 117/88; 117/89; 117/93; 117/105; 359/580; 359/581; 359/586; 359/588; 359/885; 359/888

(58) Field of Classification Search ............... 427/162, 427/163.1, 163.2, 164, 166, 167, 248.1, 255.15, 427/255.19, 255.23, 255.26, 255.7, 402, 427/419.2, 419.3; 117/84, 88, 89, 93, 105; 359/580, 581, 586, 588, 885, 888
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,915,463 A | 4/1990 | Barbee, Jr. | |
| 5,119,231 A | 6/1992 | Nelson et al. | |
| 5,380,551 A * | 1/1995 | Blonder et al. | 427/166 |
| 5,458,084 A * | 10/1995 | Thorne et al. | 117/89 |
| 5,764,416 A * | 6/1998 | Rahn | 359/586 |
| 5,851,849 A | 12/1998 | Comizzoli et al. | |
| 5,853,960 A * | 12/1998 | Tran et al. | 430/321 |
| 5,982,545 A | 11/1999 | Su | |
| 5,995,285 A | 11/1999 | Unno | |

(Continued)

FOREIGN PATENT DOCUMENTS

| | | |
|---|---|---|
| GB | 1495987 | 12/1977 |
| JP | 02283084 A * | 11/1990 |

OTHER PUBLICATIONS

Mikko Ritala, et al. "Atomic Layer Epitaxy-A Valuable Tool for Nanotechnology?", Nanotechnology 10 (1999), pp. 19-24, IOP Publishing, Ltd. U.K.

(Continued)

*Primary Examiner*—Alain L. Bashore
(74) *Attorney, Agent, or Firm*—John R. Thompson; Stoel Rives LLP

(57) ABSTRACT

A micro-optical element is produced through vapor deposition techniques, such as atomic layer deposition. An optical structure having a surface with uneven structures is exposed to one or more precursor vapors to create a self-limiting film growth on the surface of the optical structure. The film thickness may be increased and controlled by subsequent exposures. The resulting film conforms to surface structures having varying complex dimensions.

49 Claims, 8 Drawing Sheets

U.S. PATENT DOCUMENTS

| | | | |
|---|---|---|---|
| 6,015,590 | A | 1/2000 | Suntola et al. |
| 6,180,535 | B1* | 1/2001 | Wu et al. ............... 438/734 |
| 6,248,605 | B1* | 6/2001 | Harkonen et al. ............ 438/29 |
| 6,327,086 | B1 | 12/2001 | Unno |
| 6,388,378 | B1 | 5/2002 | Tornqvist et al. |
| 6,473,238 | B1* | 10/2002 | Daniell ................ 359/622 |
| 6,563,117 | B2* | 5/2003 | Feygin ................. 250/332 |
| 6,999,669 | B2 | 2/2006 | Summers et al. .......... 385/131 |
| 2001/0002074 | A1 | 5/2001 | Kato et al. |
| 2001/0024387 | A1 | 9/2001 | Raaijmakers et al. |
| 2001/0043320 | A1 | 11/2001 | Kato et al. |
| 2002/0015232 | A1 | 2/2002 | Nakai |
| 2002/0047175 | A1 | 4/2002 | Tani et al. |
| 2002/0074554 | A1* | 6/2002 | Sweatt et al. .............. 257/78 |
| 2002/0146511 | A1 | 10/2002 | Chiang et al. |
| 2002/0168295 | A1 | 11/2002 | Cunningham et al. |
| 2003/0015764 | A1 | 1/2003 | Raaijmakers et al. |

OTHER PUBLICATIONS

Dennis Hausmann et al., "Rapid Vapor Deposition of Highly Conformal Silica Nanolaminates." SCIENCE, vol. 298, Oct. 11, 2002, pp. 402-406.

International Searching Authority, International Search Report for PCT/US04/08762, dated Nov. 17, 2004, 2 pages.

International Searching Authority, Written Opinion of the International Searching Authority for PCT/US04/08762, dated Nov. 17, 2004, 3 pages.

Georgia Institute of Technology: Nanophotonics Research Group, "NANOPHOTONICS," News & Events, http://www.nanophotonics.gatech.edu/, printed Jan. 30, 2007, 3 pg.

Georgia Institute of Technology, "Atomic Layer Deposition for Photonic Crystal Devices," Atomic Layer Deposition 2004, Aug. 16-18, 2004, PowerPoint presentation at http://www.nanophotonics.gatech.edu/presentations/graugnard-ALD-2004.pdf, 23 pgs.

Georgia Institute of Technology; Nanophotonics Research Group: Recent Publications, "Publication List," http://www.nanophotonics.gatech.edu/publications.html#/ald, printed Jan. 30, 2007, 6 pgs.

Heineman, Dawn L., "Optimization of ALD Grown Titania Thin Films for the Infiltration of Silica Photonic Crystals," A Dissertation Presented to The Academic Faculty, Georgia Institute of Technology, Apr. 2004, 167 pgs.

* cited by examiner

CONFORMAL COATINGS FOR MICRO-OPTICAL ELEMENTS, AND METHOD FOR MAKING THE SAME

TECHNICAL FIELD

The present invention relates to techniques for fabricating optical elements and, more specifically, to techniques for depositing thin films on optical elements having a surface uneven structures.

BACKGROUND OF THE INVENTION

Micron-scale fabrication has enabled the development of micro-optical elements that are used in a variety of optical-electronic applications. A micro-optical element (MOE) offers compact, light-weight optics that can be mass-produced using low cost replication techniques. With the given trend towards miniaturization, these features are highly attractive. MOEs may be refractive, such as microlenses and microlens arrays, and bend or focus light according to geometric optics. MOEs may be diffractive, such as phase plates, diffraction gratings, diffractive lenses, and so forth, and alter light based on Fourier optics. MOEs may also be mixed refractive/diffractive lenses which typically involves the refractive lenses having a surface textured with diffracting patterns.

MOEs include three-dimensional surface structures that are typically based on complex mathematical modeling. Dimensional accuracy and fabrication cost are important factors in production. MOEs can be divided into two basic families: continuous relief and binary, or multi-level, micro-optics. Continuous relief microstructures have a smoothly varying surface profile between multiple steps. Fabrication methods for continuous-relief micro-optics include direct writing, such as by laser beam or e-beam, direct machining, photoresist reflow, and gray tone lithography. Binary optical elements have phase levels with a number of steps and a flat surface of a constant height between the steps. A common fabrication method for binary MOEs is a high-resolution mask lithography and etching process.

MOEs are still an emerging technology that has not yet developed a uniformly accepted nomenclature. The following components are subgroups of micro-optical elements and include, Diffractive Optical Element (DOE), Binary Optical Element (BOE), Binary Optic, Microstructured Optic, grating, blazed grating, fresnel element, micro-relief element, nanoperiodic surface structures, refractive micro optics, subwavelength structure, and subwavelength structured surface. As can be expected, each subgroup has certain features specific to that group. As used herein, the term MOE indicates all of the above listed components. It is also expected that there will be applications where MOEs will be integrated on top of light detecting and light emitting devices and integrated circuits.

DOEs are a broad class of optical components. Unlike conventional optical components utilizing refraction and/or reflection, DOEs utilize the wave nature of light and rely on amplitude, phase, and the polarization state of light. With diffractive optics all these properties can be modified using nano/micro structures. Diffraction structures on a surface can be of several principles including binary, multi-level, continuous profile, index modulated, and holographica.

All MOEs, either refractive or diffractive, have in common that the wave nature of light is applied for their design and their performance and tolerance modelling. Furthermore, all MOEs used herein have three-dimensional surface structures with a dimension of about 0.01 microns to about 10 micron.

A MOE may employ a film or coating disposed on its surface structures for a variety of purposes. The film or coating may be a semiconductor layer, insulator, metal contact, passivation layer, anti-reflective coating, optical filter, waveguide or other coating. The film or coating preferably follows a surface pattern of the MOE. Otherwise, the functionality may be severely degraded or the element may be out of a specification range. In particular, MOEs with structures having dimensions smaller than the wavelength of light are difficult structures on which to apply conformal coatings of uniform thickness. Such a structure is commonly referred to herein as a subwavelength structure. Fabrication is further complicated where such structures have high aspect ratios.

A number of techniques exist to provide thin films and coatings. These techniques include sputtering, evaporation, pulsed laser ablation, oxidation, chemical vapor deposition, electroplating, and other techniques commonly known in the art. However, these conventional techniques are not able to provide conformal coatings with uniform thickness for a subwavelength structure.

Referring to FIG. 1, a cross-section view of a substrate 10 is shown wherein a thin film 12 is deposited by physical vapor deposition (PVD). The PVD technique removes coating material from a source using high temperature (evaporation) and/or bombards the surface with highly energetic particles (sputtering). Removed material particles have kinetic energy and this kinetic energy is used to transfer coating material onto the substrate 10. On an atomic scale, sputtered atoms tend to travel in straight lines without in-flight collisions from a cathode to the sample.

When coating material arrives on a substrate its energy does not allow extended movement on the substrate surface. As shown, the thin film 12 does extend to a shadowed region 14 and does not provide step coverage. This problem is pronounced where a subwavelength structure is involved. The shadowed region 14 may be caused by the shadow of the substrate 10 or even by the growing thin film 12.

Methods to improve conformity involve rotating the substrate 10 or heating the substrate 10 to increase atom mobility. However, the shadowed region will not be fully eliminated. Furthermore, because PVD is based on flying material there is always a "line of sight" problem so that sides of walls are difficult to coat. In case of high aspect ratio good step coverage is impossible.

Referring to FIG. 2, a cross-sectional view is shown of a structure 20 is shown having a trench 22. A thin film 24 is deposited by chemical vapor deposition (CVD). CVD techniques use continuous precursor flow to mix precursors in a reaction chamber where a structure is placed. Energy is applied to the structure and the precursor vapor to form a layer of a desired composition.

CVD methods have difficulties in applying very thin films because the film does not always conform. As shown in FIG. 2, the growth of the thin film 24 is not always uniform and does not exactly follow the underlying surface. Voids 26 are created underneath the film 26 as the trench 22 is filled. Thus, the reliability of the CVD method for thin films is often in question.

Referring to FIG. 3, a similar problem is shown wherein a structure 30 includes a narrow trench 32. A thin film 34 is deposited by a technique such as by CVD in order to completely fill the trench 32. The thin film 34 pinches off at the opening 36 of the trench 32 before the trench 32 is completely filled. This creates a void 38 within the trench 32 which destroys functionality of the structure 30.

Referring to FIG. 4, another structure 40 is shown having multiple step levels. A thin film 42 is deposited by sputtering. Directionality of the sputtering is indicated by the arrows 44. Directionality may be achieved by long distance origination and mask and/or with ion beam sputtering. No side wall coating exists where the film 42 is less than a step height.

Referring to FIG. 5, a structure 50 is shown similar to that of FIG. 4. The sidewalls 52 are completely covered by increasing the thickness of the film 54. This is, however, practical only in applications having shallow steps and low aspect ratios.

Referring to FIG. 6, a structure 60 is shown with a trench 62 having a relatively high aspect ratio. Difficulties arise with conventional techniques, such as CVD, in having a film 64 conform to the deep trench 62. As shown, a void 66 occurs when the film 64 fails to fully conform to the trench 62.

Referring to FIG. 7, a structure 70 is shown with a thin film 72 that is deposited by CVD or sputtering. The film 72 conforms poorly to the structure 70 and provides poor structural dimensions.

The present inventors have recognized that the problems with thin film depositions illustrated in FIGS. 1 to 7 often become even more pronounced with subwavelength structures. Techniques for overcoming void formations and providing controlled conformal coatings would greatly improve the performance of micro-optical elements. Such techniques would have particular application beneficial for light transmissive optics that include anti-reflective coatings.

SUMMARY OF THE INVENTION

The present invention utilizes vapor deposition techniques to provide conformal film growth for a micro-optical element. The film is deposited on an optical structure that is suitable for use in a variety of applications such as a beam shaper, beam splitter, microlens, microlens array, diffuser, laser diode corrector, pattern generator, collimator, grating device, DNA chip, biochip, optical filter, waveguide, optical attenuator, gain flattening filter, grayshade filter and anti-reflective coating structures. The optical structure may be formed through any number of conventional processing techniques.

In fabrication, an optical structure is placed in a reaction chamber and exposed to a precursor vapor. The exposure creates a chemical adsorption of a portion of a first chemical on the surface of the optical structure. In one implementation, a purging gas is introduced into the chamber to remove excess of the first chemical and byproduct. A second chemical, different from the first chemical, is introduced into the reaction chamber where it reacts with the adsorbed first chemical to form a film conforming with the surface of the optical structure.

The final film thickness is controlled by the number of deposition cycles. Self-limiting growth provides excellent surface conformance and allows coatings on high aspect ratio structures and subwavelength structures. The present invention provides films that are sufficiently thin and precise for practical applications for MOEs. Furthermore, the resulting films are pinhole free which is necessary for functionality in certain applications.

Additional aspects and advantages of this invention will be apparent from the following detailed description of preferred embodiments, which proceeds with reference to the accompanying drawings.

BRIEF DESCRIPTION OF THE DRAWINGS

Non-exhaustive embodiments of the invention are described with reference to the figures in which.

DETAILED DESCRIPTION OF PREFERRED EMBODIMENTS

Figure 1:
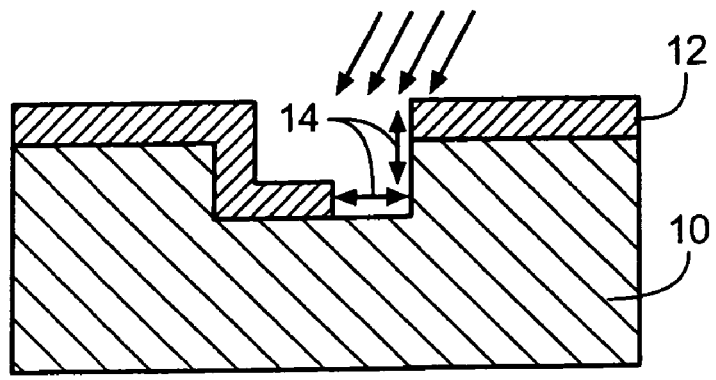
FIG. 1 is a cross-sectional diagram of a MOE.
Figure 2:
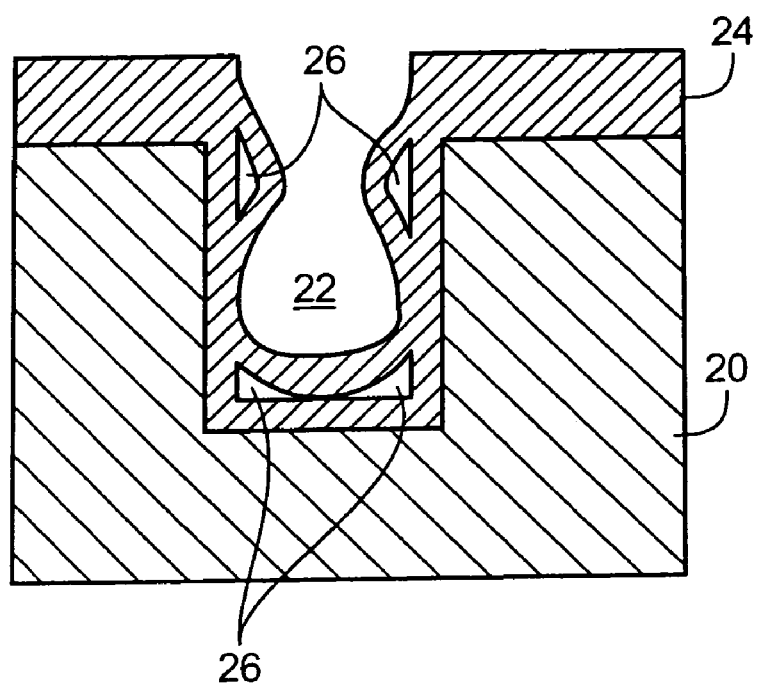
FIG. 2 is a cross-sectional diagram of a MOE.
Figure 3:
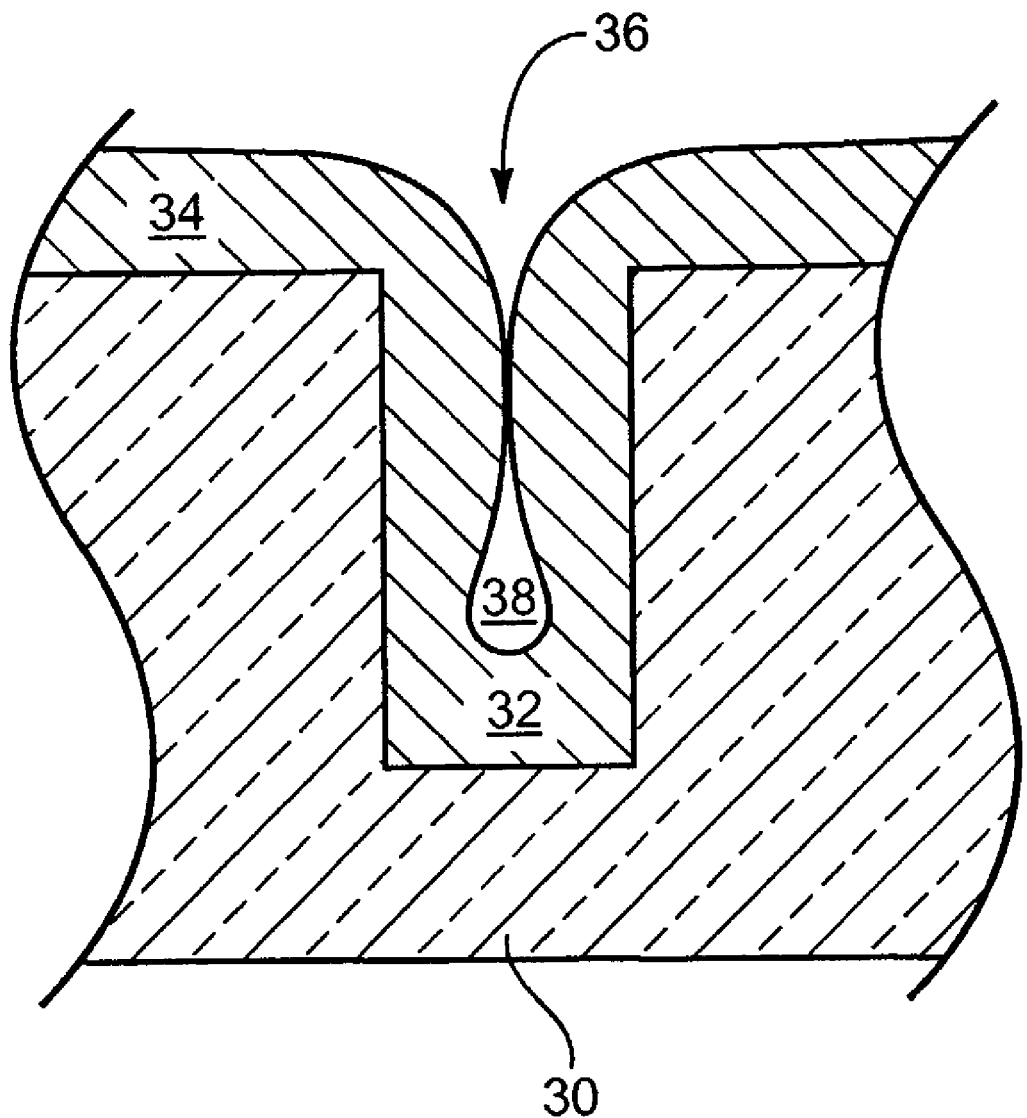
FIG. 3 is a cross-sectional diagram of a MOE.
Figure 4:
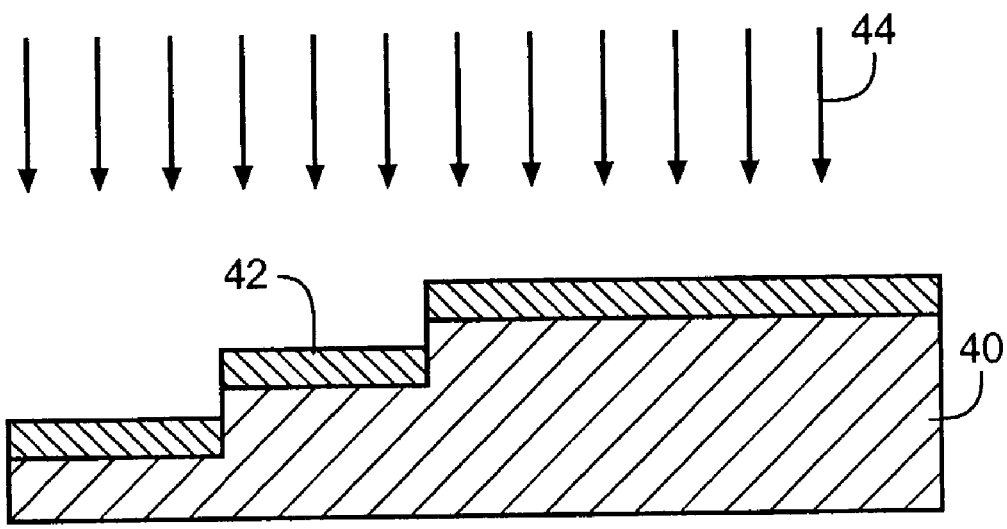
FIG. 4 is a cross-sectional diagram of a MOE.
Figure 5:
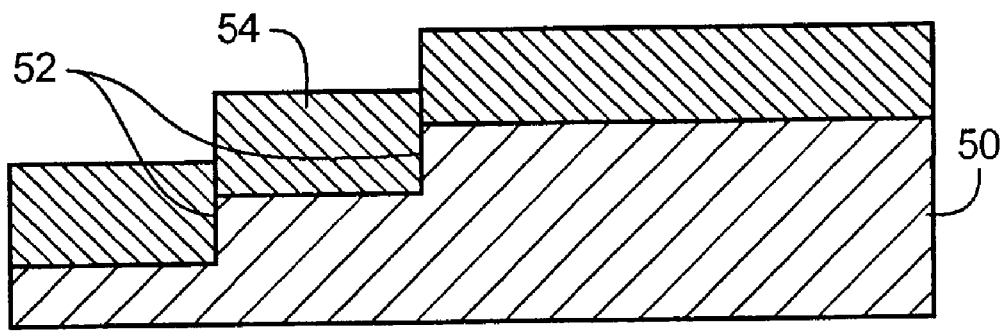
FIG. 5 is a cross-sectional diagram of a MOE.
Figure 6:
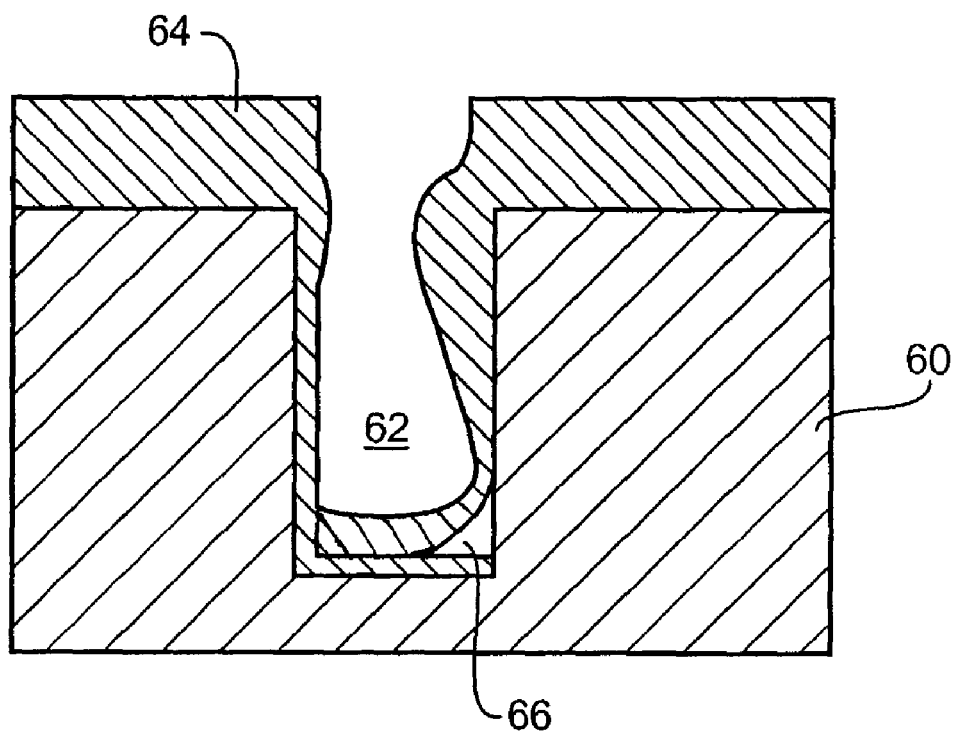
FIG. 6 is a cross-sectional diagram of a MOE.
Figure 7:
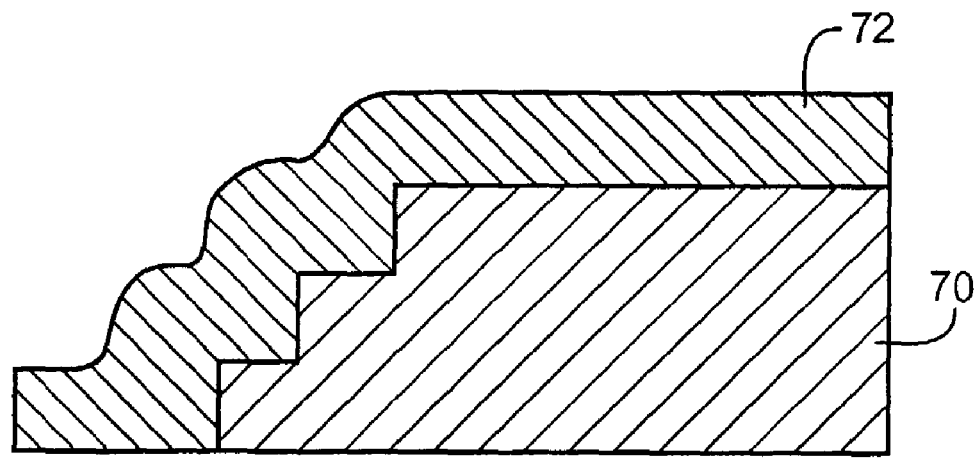
FIG. 7 is a cross-sectional diagram of a MOE.

Reference is now made to the figures in which like reference numerals refer to like elements. For clarity, the first digit or digits of a reference numeral indicates the figure number in which the corresponding element is first used.

Throughout the specification, reference to "one embodiment" or "an embodiment" means that a particular described feature, structure, or characteristic is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. Those skilled in the art will recognize that the invention can be practiced without one or more of the specific details, or with other methods, components, materials, etc. In other instances, well-known structures, materials, or operations are not shown or not described in detail to avoid obscuring aspects of the invention.

Sequential vapor deposition (SVD) is a term used herein to include various techniques of exposing a surface to sequentially pulsed chemical vapors to form a film on the surface. A feature of SVD is that the process is self-limiting in that each applied reaction terminates without intervention. With SVD, a substrate or other structure is placed in a reaction chamber where a first chemical, which may be in the form of a vapor, reacts with the surface and at least a portion of the first chemical is adsorbed onto the surface.

Excess first chemical and any reaction byproducts are then purged from the chamber and a second chemical, which may also be in the form of a vapor, is introduced. The second chemical reacts with the adsorbed first chemical and forms additional material on the surface. The amount of material deposited is limited by the reaction. Accordingly, the number of exposures determines the thickness of the material. This process may be continued until the desired layer thickness and uniformity is achieved. SVD is particularly advantageous when using thin film layers with subwavelength structures, especially those with narrow openings and/or with high aspect ratios.

Although SVD is similar to CVD it is significantly different in that SVD is self-limiting and relies on sequential pulses of exposure to create films of desired thickness. CVD also includes a variety of more specific processes, including, but not limited to, metalorganic CVD, plasma enhanced CVD and others. CVD is commonly used to form non-selectively a complete, deposited material on a substrate. CVD uses the simultaneous presence of multiple species in a reaction chamber to react and form the deposited material.

With CVD, the growth of thin films is primarily adjusted by controlling the inflow rates of starting materials impinging on the substrate. This differs from SVD wherein a substrate is contacted with a single deposition species that chemisorbs to a substrate or previously deposited species, thus allowing the substrate qualities rather than the starting material concentrations or flow variables to control the deposition rate and film quality.

Atomic layer deposition (ALD) is a form of SVD and has been used to manufacture electroluminescent displays for over 20 years. ALD has been referred to as Atomic Layer Epitaxy, but this reference is more appropriately used for epitaxial films only. Various techniques for ALD are disclosed in U.S. Pat. Nos. 4,058,430, 4,413,022, 5,711,811, and 6,015,590, all of which are incorporated herein by reference. Recently ALD has gained significant interest in the semiconductor and data storage industries. The films that this technique yields have exceptional characteristics such as being pinhole free and possessing excellent uniformity and step coverage even on very high aspect ratio structures. ALD technique is also well suited for precise tailoring of material compositions.

In performing ALD, process conditions, including temperatures, pressures, gas flows and cycle timing, are adjusted to meet the requirements of the process chemistry and substrate materials. The temperature and pressure are controlled within a reaction chamber. Typical temperatures are approximately 20 to 600 C and pressure ranges from about 10 to 10,000 Pascal. Once the reaction space reaches a stable temperature and pressure, a first precursor vapor is directed over the substrate. In some cases also extra heating time or in-situ cleaning may be needed to remove any harmful contaminants from the substrate.

For true ALD, the first precursor vapor reacts only with a surface, and does not react to itself, and the process is therefore self-limiting. In actual practice the first precursor vapor may attach to a limited amount of the same type of molecules, but the growth is still self-limiting. Extended exposure of the precursor vapor does not increase the amount of the film that attaches to the surface.

An inert purge gas is introduced to remove any excess of the first vapor and any volatile reaction products. The embodiments of the deposition process are described herein as involving purging with an inert gas. The terms "purging" and "purge" are intended to be construed broadly, to include not only flushing of the reaction space by introduction of a flow of an inert gas or other material, but also more generally to include the removal or cleansing of excess chemicals and reaction byproducts from the reaction space. For example, excess chemicals and reaction byproducts may be removed from the reaction space by pumping the reaction space and/or by lowering the pressure within the reaction space. Consistent with the broad definition of the term "purge," the removal of excess chemicals from the reaction space need not be perfectly effective, but will typically involve leaving surface bound chemicals and possibly some insignificant amount of non-surface bound chemicals or residual matter within the reaction space.

Moreover, when a purge gas is used to remove chemicals from the reaction space, various inert and non-inert purge gases may be used. Preferred purge gases are include nitrogen ($N_2$), helium (He), neon (Ne), argon (Ar), carbon dioxide ($CO_2$), and mixtures thereof. A constant or pulsed flow of one or more of these purge gases may also be used to transport the first chemical and the second chemical into the reaction space and/or to adjust the pressure within the reaction space.

A second precursor vapor is introduced into the reaction chamber and reacts with the adsorbed first precursor vapor and creates a film conforming to the optical structure. As with the first precursor vapor, the second precursor vapor does not react to itself or attaches only to a limited amount of itself. Accordingly, extended exposure of the second precursor vapor does not increase the thickness of the film. The film may serve any number of applications including an antireflection coating, optical low pass filter, optical high pass filter, optical bandpass filter, optical bandreject filter, waveguide, optical attenuator, gain flattening filter, gray scale filter or a passivation layer.

The growth experienced for each introduced precursor vapor is typically one monolayer or less. However, in some techniques it is possible to increase the growth to an amount slightly above a monolayer.

The second precursor vapor is purged to remove excess precursor vapor as well as any volatile reaction products. This completes one cycle. This procedure is repeated until the desired thickness of the film is achieved.

Successful ALD growth requires that the precursor vapors be alternately pulsed into the reaction chamber without overlap. The ALD process also requires that each starting material be available in sufficient concentration for thin film formation over the substrate area. Sufficient material also ensures that no extensive precursor decomposition takes place in the thin film formation.

Another form of SVD is a technique referenced herein as rapid vapor deposition. ALD is limited to its relatively slow deposition rates because of its deposition of one monolayer for each cycle. Rapid vapor deposition offers highly uniform and conformal coatings with faster deposition rates. With rapid vapor deposition, two different types of precursor vapor are alternatively exposed to a substrate to form an increased growth rate in a single cycle.

The first precursor vapor reacts with a surface to provide self-limiting growth of a film conforming to the surface. Extended exposure of the first precursor vapor does not increase the film thickness. The first precursor vapor and byproduct is purged from the reaction chamber such as by introducing an inert purging gas.

A second precursor vapor is introduced into the chamber and uses the first precursor film as an activator. Film growth depends on the amount of available second precursor vapor molecules. The film growth by the second precursor vapor is self-limiting in that the growth ultimately saturates and requires another activation pulse of the first precursor vapor. A distinction between rapid vapor deposition and CVD is that only one pulse of precursor vapor is required after the activator pulse. Rapid vapor deposition further differs from CVD in that film growth by both the first and second precursor vapors is self-limiting.

In one implementation, disclosed in Dennis Hausmann et al., *Rapid Vapor Deposition of Highly Conformal Silica Nanolaminates*, SCIENCE MAGAZINE, Oct. 11, 2002 at 402 which is incorporated herein by reference, the two different precursor vapors are trimethyaluminum ($Me_3Al$) and tris(tert-butoxy)silanol ($(BuO)_3SiOH$). The two precursor vapors are supplied in alternating pulses to heated substrates to form a layer of silica nanolaminates. The layer thickness per cycle depends on the size of the vapor doses and the heat of the substrate. The surface reactions of the two different precursor vapors is self-limiting as evidenced by the saturation of the growth rate at high doses of each reactant. The final result is a uniform, conformal coating similar to that provided by ALD.

In the referenced implementation, a single cycle of rapid vapor deposition produces more than 32 monolayers per cycle rather than a single monolayer as experienced with ALD. In other implementations, growth rate may range from 2 to 10 to 20 monolayers per cycle. Thus, although rapid vapor deposition provides self-limiting reactions, the growth substantially exceeds one monolayer per cycle.

SVD techniques provide excellent film depositions for MOEs. In accordance with the present invention, MOEs are fabricated for numerous applications including non-active elements such as beam shapers, beam splitters, microlenses, microlens arrays, diffusers, laser diode correctors, pattern generators, collimators, grating devices, DNA chips, biochips, anti-reflective coating structures, optical filters, waveguides, optical attenuators, gain flattening filters, grayshade filters and other applications.

MOEs are also used for active, light-emitting elements such as lasers, VCSEL lasers, LEDs, RC-LEDs and the like. Typically MOEs, and conforming films on top of MOEs, are formed on wafers for active elements like LEDs. The wafers are then cut to a final size. In addition, MOEs can be used for active, light-detecting elements such as light diodes, solar cells, CCD devices, CMOS devices and integrated circuits.

SVD techniques are able to reliably provide uniform, conformal coatings for optical structures having a surface with uneven structure having dimensions less than the 100 times the wavelength of applied light, including subwavelength micro-optical elements. A subwavelength micro-optical element has one or more uneven structures with dimensions that are less than the wavelength of applied light. Subwavelength structures may have dimensions that are the smallest manipulating dimensions possible for applied light. Subwavelength structures and structures with high aspect ratios create difficulties in achieving thin film conformity. The present invention overcomes the limitations previously experienced with coating micro-optical elements.

The MOEs of the present invention may be used for ultraviolet light, visible light, and infrared light. As defined herein, applied light includes ultraviolet, visible, and infrared light. The dimensions of subwavelength structures are relative to the applied light.

Figure 8:
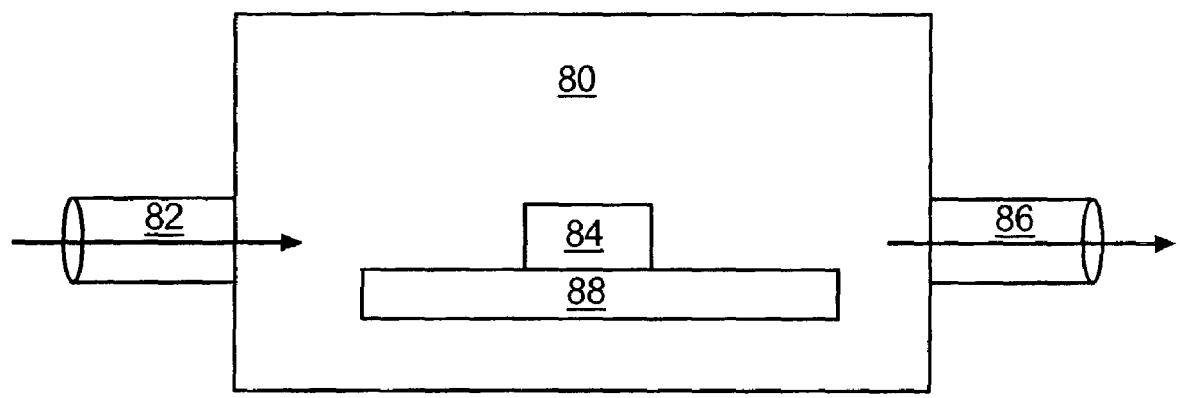
FIG. 8 is a cross-sectional view of a substrate reaction chamber configured for deposition in accordance with the present invention.

Referring to FIG. 8 representation of a reaction chamber 80 for SVD techniques. The reaction chamber 80 is a generic representation and is used for exemplary purposes only. The techniques disclosed herein may be practiced in any number of reaction chambers such as a Pulsar™ 2000 ALCVD® reactor manufactured by ASM International. Process parameters, such as temperatures, pressures, gas flows and cycle timing, may be adjusted by one of skill in the art in accordance with the substrate materials, precursor gases, and desired film thickness. Such parameters are well known to the skilled technician of ALD and rapid vapor deposition techniques.

The reaction chamber 80 may be maintained at temperatures between about 150° C. and about 600° C. It is expected that some embodiments of the deposition process may be performed at temperatures below about 150° C. and above about 600° C. Some operating temperatures may not be preferable depending on the material of the thin film to be deposited. Lower temperatures are believed to help avoid decomposition during the deposition of the organometallic chemical. For certain films, such as $TiO_2$, $Al_2O_3$, ZnO, $SiO_2$, $Ta_2O_5$, $Nb_2O_5$ and combinations thereof, the operating temperature may range from less than 150 degrees to approximately room temperature.

Gases flow into the reaction chamber 80 through one or more gas inlets 82. Gases introduced into the reaction chamber 80 include those commonly used for ALD and rapid vapor deposition techniques such as reactant precursor gases, oxidizing gases, and carrier/purging gases. Reactant precursor gases can be any type suitable for self-terminating chemisorption, such as halides, metal, Si, or Ge containing organic compounds and many others known in the art that are suitable for the desired coating and processing parameters, including substrate temperature.

A large number of coatings are suitable for MOE production depending on the intended use. In some applications the coating may be used as an antireflection coating, optical low pass filter, optical high pass filter, optical bandpass filter, optical bandreject filter, waveguide, optical attenuator, gain flattening filter, grayshade filter or a passivation layer.

The coatings include elements, Al, Ti, Si, Ge, Ta, Nb, Zr, Hf, Mo, W, V, Cr, Cu, Mo, Pt, Pd and Ir. The coatings also include nitrides such as AlN, TiN, TaN, $Ta_3N_5$, NbN, MoN, Si nitrides, Ge nitrides, Zr nitrides, Hf nitrides, W nitrides, V nitrides, Cr nitrides, Y nitrides, Ce nitrides, Mg nitrides, and Ba nitrides. The coatings further include carbides such as TiC, SiC, TaC, HfC, Al carbides, Ge carbides, Nb carbides, Zr carbides, Mo carbides, W carbides, V carbides, Cr carbides, Y carbides, Ce carbides, Mg carbides, and Ba carbides. The coatings include sulfides such as ZnS, CaS, SrS, BaS, CdS, PbS. The coatings include fluorides such as $CaF_2$, $SrF_2$, and $ZnF_2$. The coatings include transparent conductors such as $In_2O_3$, InSnO, ZnO, ZnO:Al, and Sn-oxide. The coatings include oxides, such as $Al_2O_3$, $TiO_2$, $ZrO_2$, $HfO_2$, $Ta_2O_5$, $Nb_2O_5$, $Y_2O_3$, MgO, $CeO_2$, $SiO_2$, $La_2O_3$, $SrTiO_3$, $BaTiO_3$, Ge oxides, Mo oxides, W oxides, V oxides, and Cr oxides.

In one application, such as an anti-reflective coating, the coating is a layered structure of $TiO_2$ and $Al_2O_3$. The listed coating materials are for illustrative purposes only and should not be considered exhaustive. One of skill in the art will appreciate that numerous ways exist to improve current MOE components with coatings not previously considered.

For optical purposes, transparent oxides may be used for antireflective coatings, waveguides and optical filter coatings. Gray shade filters may be created using light absorbing coatings like nitrides and carbides.

The carrier gas can be any inactive gas, such as nitrogen, helium, or argon, suitable for conveying vapor-phase reactant gases through the chamber 80 and can also be employed to purge the chamber 80 between reactant gas pulses.

The inlet 82 is configured to keep reactant gases separate until introduced into the chamber 80 to thereby avoid undesirable CVD-type reactions and consequent particle formation or thickness non-uniformity. The reactant gasses pass over an optical structure 84 where SVD occurs. The optical structure 84 represents a single structure or a batch of structures.

The optical structure 84 is the basic component of a MOE and may be any one of a number of optical structures. As such, the optical structure 84 may be configured for diffraction, refraction, reflection, grating, waveguiding or other light shaping or light conducting function. The optical structure may be disposed on a light detecting device such as a light diode, solar cell, CCD device, CMOS device, or integrated circuit. The optical structure 84 may also be an active element that generates light such as a laser, LED, and the like. The optical structure may be disposed on a light emitting device such as a laser device, VCSEL laser device, light emitting diode, RC-LED, or an integrated circuit.

The optical structure 84 includes a substrate upon which other elements of the optical structure 84 are disposed. In certain implementations, additional elements of the optical structure 84 may be integrated with the substrate. The optical structure 84 may include a variety of materials including glass, fused silica, silicon, $SiO_2$, SiON, $Si_3N_4$, metals, germanium, germanium arsenide, III-V compound, zinc selenide, zinc sulphide, II-VI compound, acrylic, epoxy, fluoro polymer, polyamide, polyimide, polystyrene, polyethylene, polyethylene terephthalate, polyurethane, PTFE, polyolefins, polycarbonate, polymethyl methacrylate (PMMA), styrene acrylonitrile, Ormocer™, an organically modified ceramics hybrid polymer manufactured by Fraunhofer-Institute for Silicate Research (Fhh-ISC), EPON SU-8 Negative which is a photodefinable epoxy resin, ormosils (organically modified silicates), nanomers (nanoparticle and organic component containing polymer type materials), plastics, and plexi-glass.

The optical structure 84 may be configured with uneven structure that are subwavelength structures. Subwavelength structures have a dimension less than the wavelength of applied light, such as ultraviolet, visible, or infrared light. Alternatively, the uneven structure have a dimension that is less than 100 times or ten times the wavelength of applied light. A dimension may be characterized as a horizontal length of a surface, vertical height of a step, depth of a trench, profile, width of a trench, and other dimensions well known in the art. The optical structure 84 may be a structure, such as a trench or well, with varying aspect ratios such as greater than 1:1 and even greater than 10:1.

The optical structure 84 may be prepared by plastics processing technologies, such as compression molding, injection molding or high pressure molding. Other processing methods include embossing, replication by ultraviolet cured embossing, casting, coining/stamping, single point diamond turning for continuous profile, and direct write lithography. Lithographic processes common to semiconductor manufacturing may also be used to form the optical structure 84. A lithographic process forms the optical structure 84 by exposing and developing the desired surface relief structure into a photosensitive material coated onto a supporting substrate and then transferring the surface relief structure into the substrate by plasma reactive ion etching or chemical etching. A surface pattern may be made directly on substrate material.

A particular application of the optical structure 84 is as non-active component that passively receives, conducts, or passes light. As defined herein, a non-active component does not generate or emit light. As a non-active component, the optical structure 84 may be a reflective structure or a DOE. The optical structure 84 may form part of a non-active MOE suitable for use as a beam shaper, beam splitter, microlens, microlens array, diffuser, laser diode corrector, pattern generator, collimator, grating device, optical filter, waveguide, optical attenuator, gain flattening filter, grayshade filter, anti-reflective coating structures, image sensor, camera lens and other numerous applications. Microlens and microlens array have particular application for use as optical readers, interfaces between laser diodes and optical fibers, diffuser screens, integral photography, and cameras. All applications referred to herein have particular needs for thin film coatings based on their intended application.

The optical structure 84 may also form part of a non-active MOE that is attached to an active component. A non-active MOE may be attached to an active component surface, such as a semiconductor device that generates light. As such, the non-active MOE may serve to diffract emitted light but does not generate the light itself. Diffractive structures attached to light path of light emitting components such as lasers and light emitting diodes (LEDs) are common applications in the art.

Another common application in the art for non-active MOEs is for receiving and detecting light. Such applications include light diodes, solar cells, CCD devices, CMOS devices and a variety of light and image sensors. Components that passively receive light are considered herein to be non-active as well.

Heaters 88, although not required in all applications, may apply heat to the optical structure 84 and process gases in accordance with process parameters. Unused gases, reaction products, and carrier gases leave the chamber 80 through a gas outlet 86.

Figure 9:
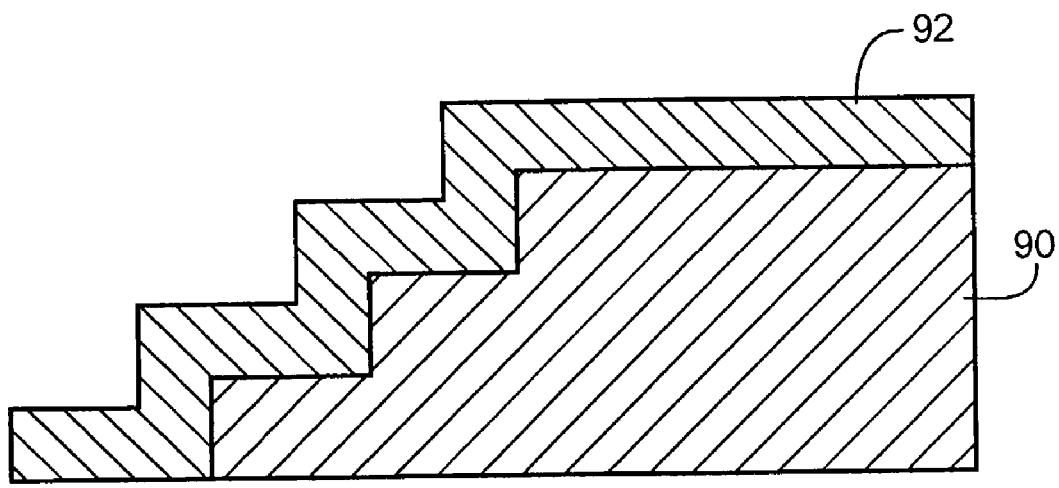
FIG. 9 is a cross-sectional diagram of a micro-optical element.

Referring to FIG. 9, an optical structure 90 with steps is shown with a thin film 92 deposited by SVD. The SVD technique provides a highly conformal thin film 92 with excellent step coverage. The SVD technique is reliable and highly repeatable.

Figure 10:
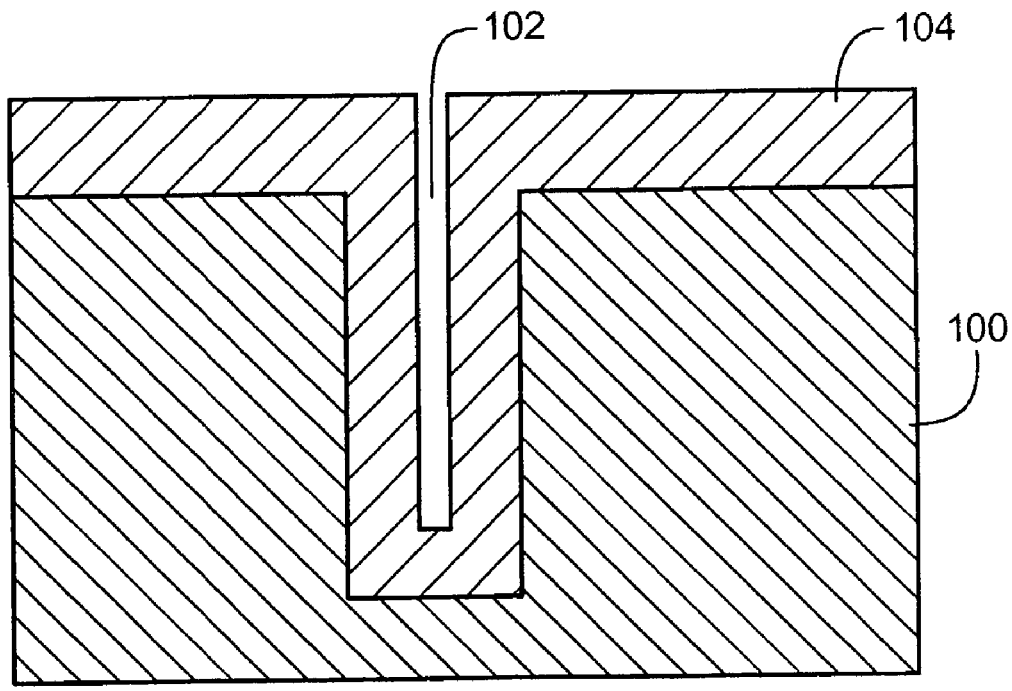
FIG. 10 is a cross-sectional diagram of a micro-optical element.

Referring to FIG. 10, an optical structure 100 with an isolated trench 102 having a high aspect ratio and a coating 104 is shown. The structure 100 may be a subwavelength structure with the trench 102 dimension having a length less than the wavelength of applied light. Once again, the SVD technique provides excellent thin film coverage thereby eliminating voids. Although, SVD can coat high aspect ratio structures, SVD cannot replicate the underlying structure. SVD growth is isotropic and SVD film growth occurs on the entire surface. Accordingly, the SVD growth will eventually planarize a structure. SVD provides excellent conformity and step coverage and realizes subnanometre level accuracy in controlling film thicknesses in addition to providing low production cost due to batch processing.

SVD applications for MOEs provide numerous advantages over conventional techniques. SVD provides self-limiting growth through either ALD or rapid vapor deposition techniques. Film thickness is controlled by the number of deposition cycles. Feedback from real-time monitoring system, e.g. optical monitoring system, can also be used for fine-tuning of the number of depositions cycles in very demanding applications. Self-limiting growth provides excellent surface conformance and allows coatings on high aspect ratio structures and subwavelength structures. Self-limiting growth enables void free trench filling and controls layer thickness as thickness is directly related to number of cycles performed.

SVD techniques allow large-area coating of larger substrates than available with other methods. This allows the use of batch equipment that provides a production cost benefit. SVD techniques further provide good reproducibility for high yields and thereby provide another production cost benefit.

SVD techniques allow for atomic level control of material composition. This enables production of coatings and thin films with sharp interfaces and lattices. SVD techniques further allow for surface modification, such as thin films that are used for hydrofobic, biocompatible, or to improve hardness. SVD is suitable for planarization of three dimensional MOEs by filling trenches without voids.

SVD relies on separate exposures of reactants such that chemical exposures are spatially and temporally separated. As such, there are no gas phase reactions with SVD and no gas phase particulate generation as with CVD. SVD allows the use of precursors that are highly reactive towards each other enabling effective material utilization. SVD provides sufficient time to complete each reaction step thereby allowing high-quality materials at low processing temperatures.

SVD techniques accommodate wide processing temperature windows. This allows preparation of multilayer structures in a continuous process. Examples of low temperature coatings include $TiO_2$ that can be coated at room temperature and $Al_2O_3$ which grows at 50 C or even below. Organic materials are especially preferred for point-of-care and personalized medical applications since glass is not accepted in certain environments.

ALD has accurate but slow growth rate. To compensate for the slow growth, batch processing may be used to increase production volume. ALD is well adapted for production of a large uniform area. Thus, ALD provides low cost MOE coating due to the conformality and large-area uniformity of batch processing. ALD can be used to coat large area substrates having dimensions from 300 mm to several meters. Furthermore, rapid vapor deposition allows for significantly faster growth rates.

SVD allows all surfaces of a substrate or surface to be coated at the same time. Coating all sides of a substrate in a single application is useful in certain instances. For example, antireflective and passivation coatings on all sides of a component are needed in certain applications. Double or multi sided coating is very difficult with some conventional methods.

Films produced by SVD are pinhole free which is vital in applications using electrical field (no breakdowns) or in protective applications against atoms/ions/molecules, biological substances or radiation energy. In these protective applications thin film layers (<20 nm) are often desired because the thin layers do not the MOE functionality. SVD enables production of very thin film layers without pinholes.

SVD may produce thin films of common low cost materials such as $Al_2O_3$, $SiO_2$, and $TiO_2$. For $Al_2O_3$, SVD can be used to produce thin films for MOEs having an index of refraction less than 1.7. For $SiO_2$ coatings, SVD can produce thin films having an index of refraction less than 1.5. For $TiO_2$, SVD can produce thin films having index of refraction greater than 2 and 2.5. The high and low refractive indexes enable the coatings for applications such as antireflective coatings, optical filter coatings, such as high pass, low pass or band pass filters and band rejecting filters, waveguides, optical aftenuators, gain flattening filters, grayshade filters and other optical coatings requiring a large difference of refractive index.

SVD provides an easy way to tune film structure on a MOE, because every pulsed material combination can be different. SVD can provide gradient refractive index layer coatings for optical elements. Tailoring of thin film structures allows also creating refractive indices, which do not exist naturally and enable flexible design of multilayer optical filters.

The SVD technique is able to make layers that are thin enough to not inhibit the functionality of the MOE. Thin films may be applied to MOEs as environmental protection barrier coatings, such as $TiO_2$ and $Ta_2O_5$, against chemical substances. Thin films may also provide biocompatible surface coatings, such as $TiO_2$ and $Ta_2O_5$. Thin films can also be used as gray shade filters by using nitrides or carbides, such as TiN, AlN, and TiC.

Although thin films created by SVD are not hard compared to other methods, they are harder than most other organic coatings. Thus, SVD can provide coatings for MOE protection against mechanical energy (scratch resistance) by using using oxides, nitrides or carbides, such as $TiO_2$, TiN, AlN, TiC.

Deposited thin films may have varying indexes of refractions depending on the intended application. An index of refraction may range from between 1.2 to greater than 3.

It is very difficult to make direct optical measurements of a MOE structure for process control purposes. Thus, a SVD process batch typically includes additional monitor glass substrates for indirect process control.

In operation, the SVD techniques of the present invention have proven superior to conventional methods in providing conformal thin films. In a first example, an optically low loss high refractive index coating was applied to a MOE at room temperature. A 155 mm×265 mm glass process monitor substrate (borosilicate glass OA-2 (NEG)) and substrates with MOE structures, were loaded into the reaction space of a flow-type ALD batch reactor. The substrate was disposed on a planar substrate holder plane in order to expose only one side of the glass substrate surface to gas flow.

After loading the substrate into the reactor, the reactor was purged with $N_2$ gas (99.99% purity, AGA). The flow rate was 2.75 SLM and pumping speed was adjusted in order to maintain a pressure of approximately 120 Pa inside the reaction space. The reaction space was allowed to stabilize for 8 hours without heating, during which time the glass substrate reached a temperature of about 22° C.

Pulses of chemicals were sequentially introduced into the reaction space to contact the surface of the substrate. The first chemical was $TiCl_4$ (99.9% purity, Sigma-Aldrich), the transition metal chemical and metal source. The second chemical was de-ionized water $H_2O$, the oxygen source. Both first and second chemicals were vaporized from external source vessels. $TiCl_4$ source material was at room temperature, approximately 21° C., and $H_2O$ source material was at 14° C. Between pulses, the reaction space is purged with $N_2$ gas.

The pulsing cycle was as follows: a $TiCl_4$ pulse, followed by an $N_2$ purge, followed by a $H_2O$ pulse, and followed by an $N_2$-purge. The pulse lengths were as follows:

| Pulse Sources | Length of Pulse (seconds) |
| --- | --- |
| $TiCl_4$ | 0.2 |
| $N_2$-purge | 10.0 |
| $H_2O$ | 0.6 |
| $N_2$-purge | 10.0 |

Figure 11:
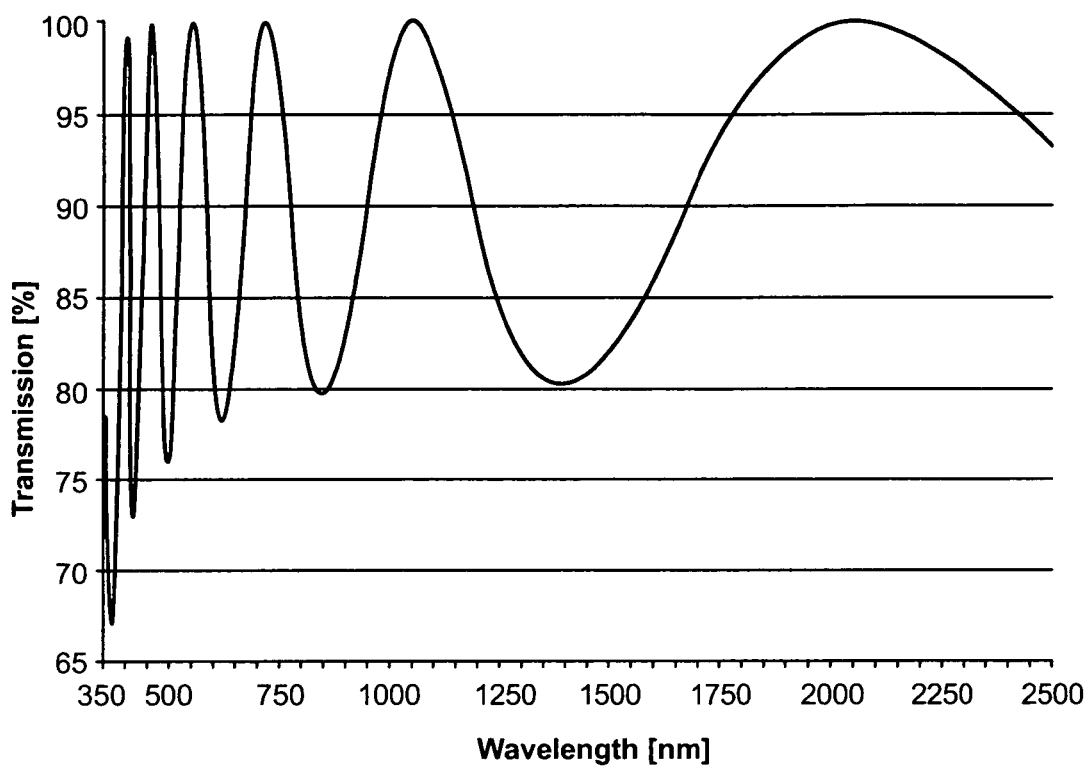
FIG. 11 is a graph illustrating the transmission spectrum of a thin film produced by the techniques of the present invention.

The pulsing cycle was repeated 6000 times. Tape testing determined that adhesion of the $TiO_2$ film to the substrate is excellent. Referring to FIG. 11, a graph is shown illustrating the transmission spectrum of the $TiO_2$ film.

The transmission data gives following refractive index values:

| Wavelength [nm] | Transmission | Approximate Refractive index (using fixed n of substrate = 1.54 @ 589.3 nm) |
|---|---|---|
| 1385 | 80.37% | 2.12 |
| 846 | 79.85% | 2.13 |
| 617 | 78.36% | 2.17 |
| 497 | 76.10% | 2.23 |
| 424 | 73.03% | 2.33 |
| 379 | 67.20% | 2.50 |

Average thickness of the $TiO_2$ film was 507 nm and average growth rate was 0.0845 nm/cycle. The transmission data shows that optical losses above 500 nm are below 0.3% and above 1000 nm below 0.1%. Without any specific optimization of the process, the values were relatively uniform, showing a thickness non-uniformity of less than 5% over the substrate area.

In a second example, a 840 nm, two layer antireflective coating is applied to an optical structure at a relatively low temperature. A two layer thin film antireflective design requires a high and low refractive index thin film. In this example $TiO_2$ is the high index and $Al_2O_3$ is the low index film. The monitor substrate is borosilicate glass OA-2 (NEG).

Two pieces of 195 mm×265 mm glass process monitor substrates were loaded into the reaction space of a flow-type ALD batch reactor also having substrates with MOE structures in same process batch run. One of the substrates was lying on the planar substrate holder frame in order to expose both sides of the glass substrate surfaces to the gas flow. This allows antireflective coating on both sides of the substrate. Another substrate was lying against the planar surface to prevent backside growth and thus has antireflective coating on only one side of the glass substrate.

After loading the substrate into the reactor, the reactor was purged with $N_2$ gas (99.99% purity, AGA). The flow rate was 2.75 SLM and pumping speed was adjusted in order to maintain a pressure of about 120 Pa inside the reaction space. The reaction space was allowed to stabilize for 8 hours, during which time the glass substrate reached a temperature of about 82° C.

Pulses of chemicals were sequentially introduced into the reaction space to contact the surface of the substrate. The first chemical was $TiCl_4$ (99.9% purity, Sigma-Aldrich), the transition metal chemical and metal source. The second chemical was de-ionized water $H_2O$, the oxygen source. Both first and second chemicals were vaporized from external source vessels. $TiCl_4$ source material was at room temperature, approximately 21° C., and $H_2O$ source material was at 14° C. Between pulses, the reaction space is purged with $N_2$ gas. Thus the pulsing cycle was as follows: a $TiCl_4$ pulse, followed by an $N_2$-purge, followed by a $H_2O$ pulse, and followed by an $N_2$-purge. The pulse lengths were as follows:

| Pulse Sources | Length of Pulse (seconds) |
|---|---|
| $TiCl_4$ | 0.4 |
| $N_2$-purge | 10.0 |
| $H_2O$ | 0.6 |
| $N_2$-purge | 10.0 |

This cycle gave growth rates of about 0.056 nm/cycle. The cycle was repeated 700 times. The refractive index of the resulting film was approximately 2.28.

The second antireflective coating included pulses of TMA (99.9% purity, Crompton), the organometallic chemical and aluminium source having temperature of 21° C. The second coating also included pulses of de-ionized water $H_2O$, the oxygen source having temperature of 14° C. Both chemicals were vaporized from external source vessels and introduced into the reaction space such that they sequentially contacted the surface of the substrates. Between pulses, the reaction space was purged with $N_2$ gas. Thus the pulsing cycle was as follows: a TMA pulse followed, by an $N_2$-purge, followed by a $H_2O$ pulse, and followed by an $N_2$-purge. The pulse lengths were as follows:

| Pulse Sources | Length of Pulse (seconds) |
|---|---|
| TMA | 0.4 |
| $N_2$-purge | 7.0 |
| $H_2O$ | 0.6 |
| $N_2$-purge | 10.0 |

This cycle provides a growth rate of approximately 0.081 nm/cycle. The cycle was repeated 2130 times. The refractive index was about 1.60.

After the second layer cycles were complete, an antireflective film was present on the glass substrate. The antireflective film completely covered the exposed surface of the glass substrate. The resulting glass substrate was removed from the reaction space. Tape testing was performed to determine adhesion of the antireflective film to the substrate, which was found to be excellent.

Figure 12:
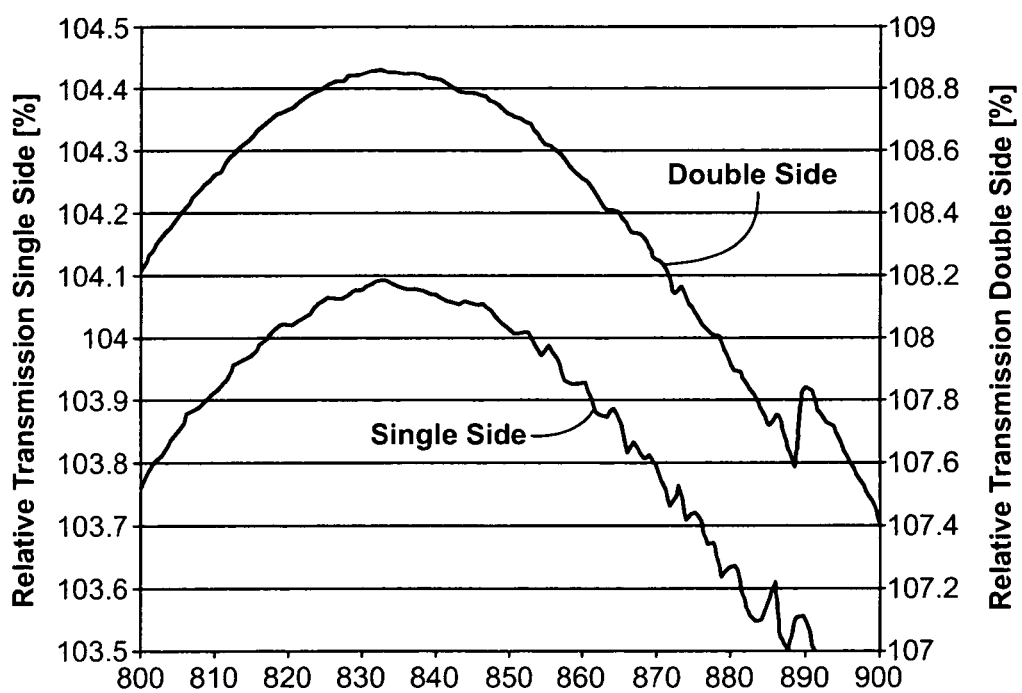
FIG. 12 is a graph illustrating the transmission spectrum of another thin film produced by the techniques of the present invention.

Referring to FIG. 12, a graph is shown illustrating the transmission spectrum of the resulting antireflective thin film. The antireflective thin film was analyzed with a spectrophotometer to provide the plotted relative transmissions.

Without any specific optimization of the process, the peak wavelength values were relatively uniform. Over the substrate area, the substrate having a single side coating had an average peak wavelength of 838 nm with a standard deviation of 2.6 nm. The substrate having a double side coating had an average peak wavelength of 837 nm with a standard deviation of 2.6 nm. Tuning of the filter may be easily changed by altering the number of cycles.

In a third example, a $SiO_2$:$Al_2O_3$ coating is applied to a substrate using the RVD technique. A 155 mm×265 mm glass process monitor substrate (borosilicate glass OA-2 (NEG)) and substrates with MOE structures, were loaded into the reaction space of a flow-type ALD batch reactor. The substrate was lying on the planar substrate holder plane in order to expose only one side of the glass substrate surface to the gas flow.

After loading the substrate into the reactor, the reactor was purged with $N_2$ gas (99.99% purity, AGA). The flow rate was 3 SLM and pumping speed was adjusted in order to maintain a pressure of about 90 Pa inside the reaction space. The reaction space was allowed to stabilize for 5 hours, during which time the glass substrate reached a temperature of about 300° C.

Alternating pulses of first and second chemicals were then introduced into the reaction space. The first chemical was a chemical compound containing silicon and TMA (Trimethylaluminium $Al(CH_3)_3$, 99.9% purity, Crompton), the organometallic chemical and aluminium source. The second chemical was "Tris (Tert-Butoxy) Silanol" (99.999% purity) manufactured by the Aldrich Chemical Company, Inc. The chemicals were vaporized from external source vessels and introduced into the reaction space such that they sequentially contacted the surface of the substrates. The TMA source material was at room temperature (about 21° C.) and "Tris (Tert-Butoxy) Silanol" source material was at 85° C. Between pulses, the reaction space was purged with $N_2$ gas. Thus the pulsing cycle was as follows: a TMA pulse, followed by an $N_2$-purge, followed by a "Tris (Tert-Butoxy) Silanol" pulse, and followed by an $N_2$-purge. The pulse lengths were as follows:

| Pulse Sources | Length of Pulse (seconds) |
|---|---|
| TMA | 0.6 |
| $N_2$-purge | 2.0 |
| "Tris (Tert - Butoxy) Silanol" | 10.0 |
| $N_2$-purge | 4.0 |

This cycle was repeated 200 times. One cycle results in a low index film having approximately one layer of $Al_2O_3$ and 3 layers of $SiO_2$.

Tape testing was performed to determine the adhesion of the $SiO_2$ film to the substrate, which was found to be excellent. Average thickness of the $SiO_2$ film was 223 nm and average growth rate was 1.12 nm/cycle. The refractive index was approximately 1.474. Without any specific optimization of the process, the values were relatively uniform, showing a thickness non-uniformity of less than 2% over the substrate area.

In a fourth example, an optically low loss high refractive index $Ta_2O_5$ coating was applied to a substrate at a relatively moderate temperature. A 195 mm×265 mm glass process monitor substrate (borosilicate glass OA-2 (NEG)) and substrates with MOE structures, were loaded into the reaction space of a flow-type ALD batch reactor. The substrate was lying on the planar substrate holder plane in order to expose only one side of the glass substrate surface to the gas flow.

After loading the substrate into the reactor, the reactor was purged with a $N_2$ gas (99.99% purity, AGA). The flow rate was 2.75 SLM and pumping speed was adjusted in order to maintain a pressure of about 120 Pa inside the reaction space. The reaction space was allowed to stabilize for three hours, during which time the glass substrate reached a temperature of about 250° C.

Alternating pulses of chemicals were sequentially introduced into the reaction space. A first chemical was Tantalum (V) pentakis-ethoxide $[Ta(OEt)_5]_2$ (99.99% Inorgtech), the organometallic chemical and tantalum metal source. The second chemical was de-ionized water $H_2O$, the oxygen source. The first and second chemicals were vaporized from external source vessels and introduced into the reaction space such that they sequentially contacted the surface of the substrates. The $[Ta(Oet)_5]_2$ source material was at temperature 140° C. and $H_2O$ source material was at 20° C. Between pulses, the reaction space was purged with $N_2$ gas. Thus the pulsing cycle was as follows: a $TiCl_4$ pulse, followed by an $N_2$-purge, followed by a $H_2O$ pulse, and followed by an $N_2$-purge. The pulse lengths were as follows:

| Pulse Sources | Length of Pulse (seconds) |
|---|---|
| $[Ta(Oet)_5]_2$ | 0.6 |
| $N_2$-purge | 0.6 |
| $H_2O$ | 0.5 |
| $N_2$-purge | 1.7 |

This cycle was repeated 11605 times. Tape testing was performed to determine the adhesion of the $Ta_2O_5$ film to the glass substrate, which was found to be excellent.

Figure 13:
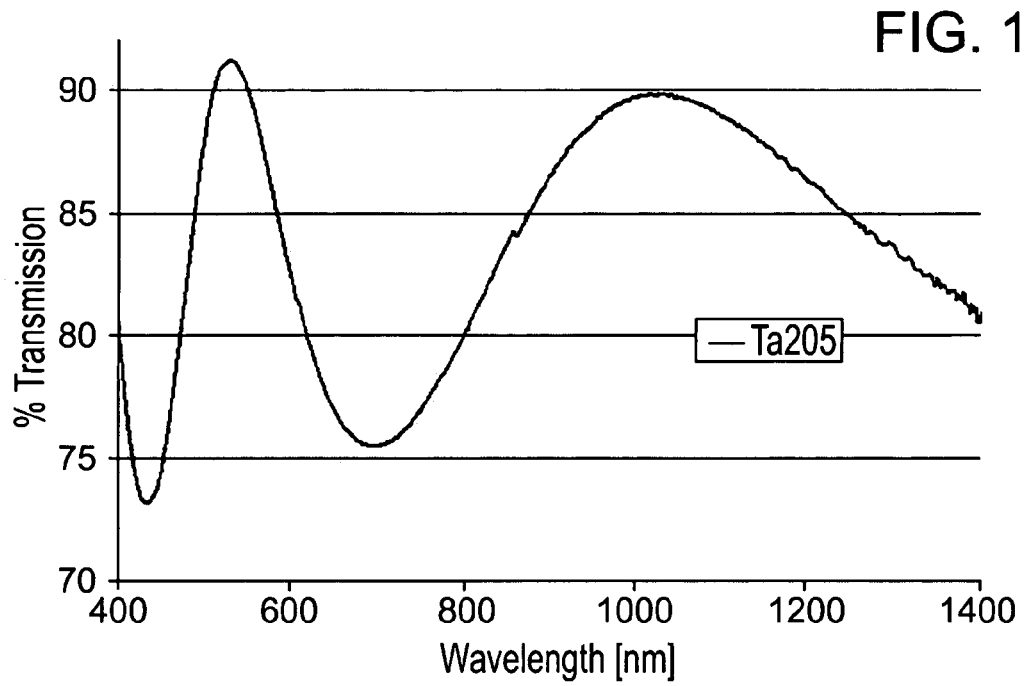
FIG. 13 is a graph illustrating the transmission spectrum of another thin film produced by the techniques of the present invention.

Referring to FIG. 13, a graph is shown illustrating the transmission spectrum of the resulting thin film. The thin film was analyzed with a spectrophotometer to provide the plotted relative transmissions.

Average thickness of the $Ta_2O_5$ film was 470 nm and average growth rate was 0.0405 nm/cycle. Typically absorption of $Ta_2O_5$ was less than 0.1%. Without any specific optimization of the process, the values were relatively uniform, showing a thickness non-uniformity of less than 3% over the substrate area.

In a fifth example, a relatively thick thin film having low optical loss and low index of refraction is formed at a moderate temperature. A 195 mm×265 mm glass process monitor substrate (glass 1737F, Corning), was loaded into the reaction space of a flow-type ALD batch reactor. The substrate was lying on the planar substrate holder plane in order to expose only one side of the glass substrate surface to the gas flow.

After loading the substrate into the reactor, the reactor was purged with $N_2$ gas (99.99% purity, AGA). The flow rate was 3 SLM and pumping speed was adjusted in order to maintain a pressure of about 120 Pa inside the reaction space. The reaction space was allowed to stabilize for 5 hours without heating, during which time the glass substrate reached a temperature of about 280° C.

Alternating pulses of first and second chemicals were then introduced into the reaction space. The first chemical was TMA (99.9% purity, Crompton), the organometallic chemical and aluminium source, having a temperature of 21° C. THe second chemical was deionized water $H_2O$, the oxygen source, having a temperature of 14° C. The precursors were vaporized from external source vessels and introduced into the reaction space with $N_2$ gas such that they sequentially contacted the substrate surface. Between pulses, the reaction space was purged with $N_2$ gas. Thus the pulsing cycle was as follows: a TMA pulse, followed by an $N_2$-purge, followed by a $H_2O$ pulse, and followed by an $N_2$-purge. The pulse lengths were as follows:

| Pulse Sources | Length of Pulse (seconds) |
|---|---|
| TMA | 1.0 |
| $N_2$-purge | 1.0 |
| $H_2O$ | 0.4 |
| $N_2$-purge | 1.0 |

Testing was performed to determine the adhesion of the $Al_2O_3$ film to the glass, which was found to be excellent.

This cycle gives a growth rate of approximately 0.10 nm/cycle. This cycle was repeated 9927 times. The refractive index of the resulting film is approximately 1.6.

Figure 14:
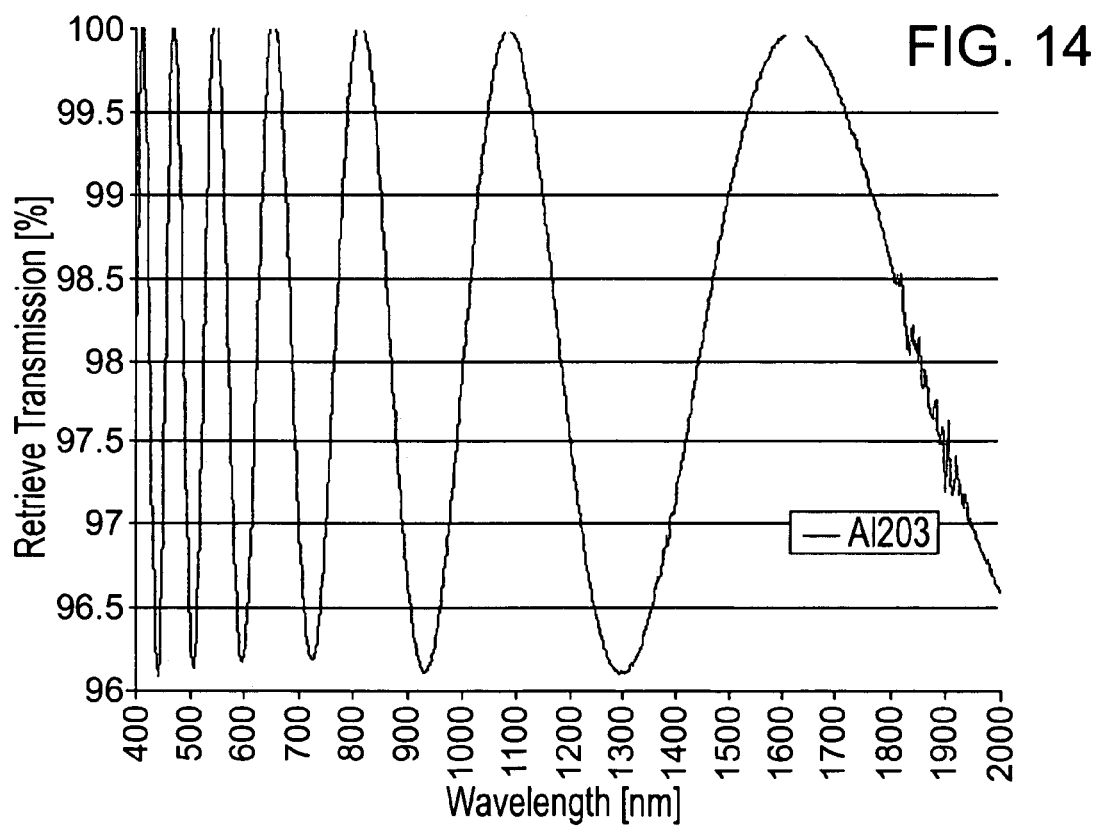
FIG. 14 is a graph illustrating the transmission spectrum of another thin film produced by the technique of the present invention.

Referring to FIG. 14, a graph is shown illustrating the transmission spectrum of the resulting thin film. The thin film was analyzed with a spectrophotometer to provide the plotted relative transmissions.

It will be obvious to those having skill in the art that many changes may be made to the details of the above-described embodiments without departing from the underlying principles of the invention. The scope of the present invention should, therefore, be determined only by the following claims.

The invention claimed is:

1. A method for fabricating a micro-optical element, comprising:
   providing an optical structure, the optical structure comprising a plurality of steps of different heights and the steps having vertical and horizontal dimensions less than the wavelength of the entire range of infrared light;
   placing the optical structure into a reaction space;
   introducing a first chemical into the reaction space such that a portion of the first chemical adsorbs onto the optical structure and forms a first film;
   after introducing the first chemical, purging the reaction space;
   introducing a second chemical into the reaction space such that a portion of the second chemical reacts with the adsorbed first chemical and forms a second film to thereby form a self-limiting film of uniform thickness and conforming to the steps to form filmed steps of different heights; and
   after introducing the second chemical, purging the reaction space.

2. The method of claim 1 wherein the first chemical adsorbed onto the optical structure forms a monolayer.

3. The method of claim 1 wherein the first chemical adsorbed onto the optical structure forms less than a monolayer.

4. The method of claim 1 wherein the optical structure is a diffractive optical structure.

5. The method of claim 1 wherein the optical structure is a refractive optical structure.

6. The method of claim 1 wherein forming the optical structure is selected from the group consisting of injection molding, compression molding, embossing, casting, and a lithographic process.

7. The method of claim 1 wherein the optical structure is a non-active element.

8. The method of claim 7 wherein the optical structure is selected from the group consisting of a beam shaper, beam splitter, microlens, microlens array, diffuser, laser diode corrector, pattern generator, collimator, grating device, DNA chip, biochip, optical filter, waveguide, optical attenuator, gain flattening filter, grayshade filter, image sensor and anti-reflective coating structures.

9. The method of claim 7 wherein the optical structure is disposed on a light detecting device.

10. The method of claim 9 wherein the light detecting device is selected from the group consisting of: light diode, solar cell, CCD device, CMOS device and an integrated circuit.

11. The method of claim 1 wherein the self-limiting film is selected from the group consisting of: antireflection coating, optical low pass filter, optical high pass filter, optical bandpass filter, optical bandreject filter, waveguide, optical attenuator, gain flattening filter, gray scale filter or a passivation layer.

12. The method of claim 1 wherein the optical structure includes a material selected from the group consisting of acrylic, epoxy, fuoro polymer, polyamide, polyimide, polystyrene, polyethylene, polyethylene terephthalate, polyurethane, PTFE, polyolefins, polycarbonate, polymethyl methacrylate (PMMA), EPON SU-8 epoxy resin, organically modified silicates (Ormosils), nanomers, plastics, and plexiglass.

13. The method of claim 1 wherein the self-limiting film has an index of refraction from approximately 1.2 to approximately 3.

14. The method of claim 1 wherein the uneven structure has vertical and horizontal dimensions less than the wavelength of visible light.

15. The method of claim 1 wherein exposing the optical structure to first and second chemicals is performed at a temperature less than 150 degrees C.

16. The method of claim 15 wherein exposing the optical structure to first and second chemicals is performed at a temperature less than 90 degrees C.

17. The method of claim 16 wherein exposing the optical structure to first and second chemicals is performed at a temperature less than 60 degrees C.

18. The method of claim 17 wherein exposing the optical structure to first and second chemicals is performed at approximately room temperature.

19. The method of claim 15 wherein the self-limiting film includes a material selected from the group of $TiO_2$, $Al_2O_3$, $HfO_2$, $ZnO$, $SiO_2$, $Ta_2O_5$, and $Nb_2O_5$.

20. The method of claim 19 wherein the self-limiting film includes a layered structure of $TiO_2$ and $Al_2O_3$.

21. The method of claim 20 wherein the self-limiting film is an anti-reflective coating.

22. The method of claim 1 wherein the uneven structure has an aspect ratio of approximately 1 to 1.

23. The method of claim 1 wherein the uneven structure has an aspect ratio of approximately 1 to 10.

24. The method of claim 1 further comprising operating the reaction space at atmospheric pressure.

25. The method of claim 1 further comprising operating the reaction space at less than atmospheric pressure.

26. The method of claim 1 further comprising operating the reaction space at a pressure from approximately 0.1 mbar to approximately 50 mbars.

27. The method of claim 1 further comprising heating the reaction space.

28. The method of claim 27 further comprising operating the reaction space at a temperature from approximately 150° C. to approximately 600° C.

29. The method of claim 27 further comprising operating the reaction space at a temperature from approximately 250° C. to approximately 550° C.

30. The method of claim 1 wherein the reaction space is included within an atomic layer deposition reactor.

31. The method of claim 1 wherein introducing the first and second chemicals into the reaction space includes using an inert carrier gas selected from the group consisting of nitrogen, helium, neon, argon, neon, and carbon dioxide.

32. The method of claim 1 wherein the first and second chemicals are in the form of a vapor.

33. The method of claim 1 further comprising flowing an inert gas through the reaction space.

34. The method of claim 1 wherein a cycle includes introducing the first chemical, purging the reaction space, introducing the second chemical, and purging the reaction space and further comprising repeating the cycle to increase the thickness of the self-limiting film.

35. The method of claim 34 further comprising repeating the cycle from 1 to 100,000 times.

36. A method for fabricating a micro-optical element, comprising:
   providing an optical structure, the optical structure having a surface with multiple subwavelength structures, the subwavelength structures including a plurality of steps of different heights and the steps having height and width dimensions less than the wavelength of the entire range of infrared light;
   placing the optical structure into a reaction space;
   introducing a first chemical into the reaction space such that a portion of the first chemical adsorbs onto the steps and forms a first film;
   after introducing the first chemical, purging the reaction space;
   introducing a second chemical into the reaction space such that a portion of the second chemical reacts with the adsorbed first chemical and forms a second film to thereby form a self-limiting film of uniform thickness and conforming to the steps to form filmed steps of different heights; and
   after introducing the second chemical, purging the reaction space.

37. The method of claim 36 wherein the first chemical adsorbed onto the optical structure forms a monolayer.

38. The method of claim 36 wherein the first chemical adsorbed onto the optical structure forms less than a monolayer.

39. The method of claim 36 wherein the optical structure is a non-active element.

40. The method of claim 36 wherein each subwavelength structure has height and width dimensions less than the wavelength of visible light.

41. The method of claim 36 wherein each subwavelength structure has an aspect ratio of approximately 1 to 10.

42. A method for fabricating a micro-optical element, comprising:
   providing an optical structure, the optical structure having a surface with multiple subwavelength structures, the subwavelength structures including a plurality of steps of different heights and the steps having height and width dimensions less than the wavelength of the entire range of infrared light and an aspect ratio of greater than 1 to 2;
   placing the optical structure into a reaction space;
   introducing a first vapor chemical into the reaction space such that a portion of the first chemical adsorbs onto the steps and forms a first film;
   after introducing the first chemical, purging the reaction space with an inert gas;
   introducing a second vapor chemical into the reaction space such that a portion of the second chemical reacts with the adsorbed first chemical and forms a second film to thereby form a self-limiting film of uniform thickness and conforming to the steps to form filmed steps of different heights; and
   after introducing the second chemical, purging the reaction space.

43. The method of claim 42 wherein the first chemical adsorbed onto the optical structure forms a monolayer.

44. The method of claim 42 wherein the first chemical adsorbed onto the optical structure forms less than a monolayer.

45. The method of claim 42 wherein the optical structure is a non-active element.

46. The method of claim 42 wherein each subwavelength structure has height and width dimensions less than the wavelength of visible light.

47. The method of claim 27, wherein the self-limiting film includes a material selected from the group of $TiO_2$, $Al_2O_3$, $ZnO$, $SiO_2$, $Ta_2O_5$, $Nb_2O_5$ and $HfO_2$.

48. The method of claim 36, wherein the self-limiting film includes a material selected from the group of $TiO_2$, $Al_2O_3$, $ZnO$, $SiO_2$, $Ta_2O_5$, $Nb_2O_5$ and $HfO_2$.

49. A method for fabricating a micro-optical element, comprising:
   providing an optical structure, the optical structure including an optic comprising a plurality of steps of different heights and each step having vertical and horizontal dimensions;
   placing the optical structure into a reaction space;
   introducing a first chemical into the reaction space such that a portion of the first chemical adsorbs onto the optic and forms a first film;
   after introducing the first chemical, purging the reaction space;
   introducing a second chemical into the reaction space such that a portion of the second chemical reacts with the adsorbed first chemical to form a second film to thereby form a self-limiting film of uniform thickness and conforming to the steps to form filmed steps of different heights; and
   after introducing the second chemical, purging the reaction space.

* * * * *

UNITED STATES PATENT AND TRADEMARK OFFICE
CERTIFICATE OF CORRECTION

PATENT NO. : 7,294,360 B2  Page 1 of 1
APPLICATION NO. : 10/404928
DATED : November 13, 2007
INVENTOR(S) : Maula et al.

It is certified that error appears in the above-identified patent and that said Letters Patent is hereby corrected as shown below:

Title Page item 56
In the "Other Publications," the Dennis Hausmann, et al. entry should read:

Dennis Hausmann et al., "Rapid Vapor Deposition of Highly Conformal Silica Nanolaminates," SCIENCE, vol. 298, Oct. 11, 202, pp. 402-406.

In the "Other Publications," the first Georgia Institute entry should read:

Georgia Institute of Technology: Nanophotonics Research Group, "NANOPHOTONICS," News & Events, http://www.nanophotonics.gatech.edu/, printed Jan. 30, 2007, 3 pgs.

In the "Other Publications," the second Georgia Institute entry should read:

Georgia Institute of Technology: "Atomic Layer Depositions for Photonic Crystal Devices," Atomic Layer Deposition 2004, Aug. 16-18, 2004, PowerPoint presentation at http://www.nanophotonics.gatech.edu/presentations/graugnard-ALD-2004.pdf, 23 pgs.

Signed and Sealed this

Twenty-ninth Day of July, 2008

JON W. DUDAS
*Director of the United States Patent and Trademark Office*